(12) United States Patent
Beer et al.

(10) Patent No.: US 9,711,462 B2
(45) Date of Patent: Jul. 18, 2017

(54) PACKAGE ARRANGEMENT INCLUDING EXTERNAL BLOCK COMPRISING SEMICONDUCTOR MATERIAL AND ELECTRICALLY CONDUCTIVE PLASTIC MATERIAL

(71) Applicant: Infineon Technologies AG, Neubiberg (DE)

(72) Inventors: Gottfried Beer, Nittendorf (DE); Dominic Maier, Pleystein (DE); Ulrich Wachter, Regensburg (DE); Daniel Kehrer, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/889,370

(22) Filed: May 8, 2013

(65) Prior Publication Data
US 2014/0332936 A1    Nov. 13, 2014

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/56* (2013.01); *H01L 23/3121* (2013.01);
(Continued)

(58) Field of Classification Search
CPC ..... H01L 2924/3025; H01L 2225/1058; H01L 23/552; H01L 21/565; H01L 2924/15174;
(Continued)

(56) References Cited

U.S. PATENT DOCUMENTS 7,759,805 B2   7/2010   Beer et al.
8,080,444 B2   12/2011  Sarihan
(Continued)

FOREIGN PATENT DOCUMENTS

CN    102760667 A    10/2012
CN    103022011 A    4/2013

OTHER PUBLICATIONS

Application documents filed on Aug. 4, 2014 in the related U.S. Appl. No. 14/450,307, 46 pages.
(Continued)

*Primary Examiner* — Marcos D Pizarro
*Assistant Examiner* — Nelson Garces
(74) *Attorney, Agent, or Firm* — Viering, Jentschura & Partner mbB

(57) ABSTRACT

In various embodiments, a package arrangement may be provided. The package arrangement may include at least one chip. The package arrangement may further include encapsulation material at least partially encapsulating the chip. The package arrangement may also include a redistribution structure over a first side of the chip. The package arrangement may further include a metal structure over a second side of the chip. The second side may be opposite the first side. The package arrangement may additionally include at least one of a semiconductor structure and an electrically conductive plastic material structure electrically coupled to the redistribution structure and the metal structure to form a current path between the redistribution structure and the metal structure.

25 Claims, 8 Drawing Sheets

(51) Int. Cl.
*H01L 21/58* (2006.01)
*H01L 21/60* (2006.01)
*H01L 23/52* (2006.01)
*H01L 25/065* (2006.01)
*H01L 23/31* (2006.01)
*H01L 23/00* (2006.01)

(52) U.S. Cl.
CPC .......... *H01L 23/3128* (2013.01); *H01L 24/18* (2013.01); *H01L 24/19* (2013.01); *H01L 24/20* (2013.01); *H01L 24/97* (2013.01); *H01L 2224/04105* (2013.01); *H01L 2924/1305* (2013.01); *H01L 2924/1306* (2013.01); *H01L 2924/13055* (2013.01); *H01L 2924/13091* (2013.01); *H01L 2924/1461* (2013.01); *H01L 2924/181* (2013.01)

(58) Field of Classification Search
CPC ... H01L 2224/12105; H01L 2924/1532; H01L 24/94; H01L 21/563; H01L 2223/6677; H01L 2225/06551; H01L 2225/06555; H01L 21/56; H01L 2224/023; H01L 24/18; H01L 24/20; H01L 24/19; H01L 24/97; H01L 23/3128; H01L 23/3121; H01L 2924/181; H01L 2924/1305; H01L 2924/13091; H01L 2924/1461; H01L 2924/13055; H01L 2224/04105
USPC .................................................. 257/655–665
See application file for complete search history.

(56) References Cited

U.S. PATENT DOCUMENTS

| | | | |
|---|---|---|---|
| 8,084,300 | B1 | 12/2011 | San Antonio et al. |
| 8,378,466 | B2 | 2/2013 | Chiu et al. |
| 2004/0231872 | A1 | 11/2004 | Arnold et al. |
| 2009/0302435 | A1 | 12/2009 | Pagaila et al. |
| 2010/0110656 | A1 | 5/2010 | Ko et al. |
| 2010/0224969 | A1 | 9/2010 | Tang |
| 2010/0327351 | A1* | 12/2010 | Yamazaki ............... 257/347 |
| 2011/0278736 | A1 | 11/2011 | Lin et al. |
| 2011/0285007 | A1* | 11/2011 | Chi ............... H01L 21/4846 257/686 |
| 2011/0298109 | A1* | 12/2011 | Pagaila ............... H01L 21/56 257/660 |
| 2011/0298110 | A1* | 12/2011 | Pagaila ............... H05K 1/186 257/660 |
| 2012/0268899 | A1 | 10/2012 | Haba et al. |
| 2012/0280366 | A1 | 11/2012 | Kamgaing et al. |
| 2012/0306061 | A1* | 12/2012 | Tabatabai et al. ............. 257/659 |
| 2013/0075879 | A1 | 3/2013 | Yang |
| 2013/0292808 | A1* | 11/2013 | Yen et al. ............... 257/660 |
| 2015/0189797 | A1 | 7/2015 | Oster et al. |
| 2015/0279789 | A1 | 10/2015 | Mahajan et al. |

OTHER PUBLICATIONS

Final Office Action issued in the related U.S. Appl. No. 14/450,307 mailed on Feb. 16, 2016 (9 pages).

Non-Final Office Action mailed in the related U.S. Appl. No. 14/450,307 dated Oct. 7, 2015, 8 pages.

\* cited by examiner

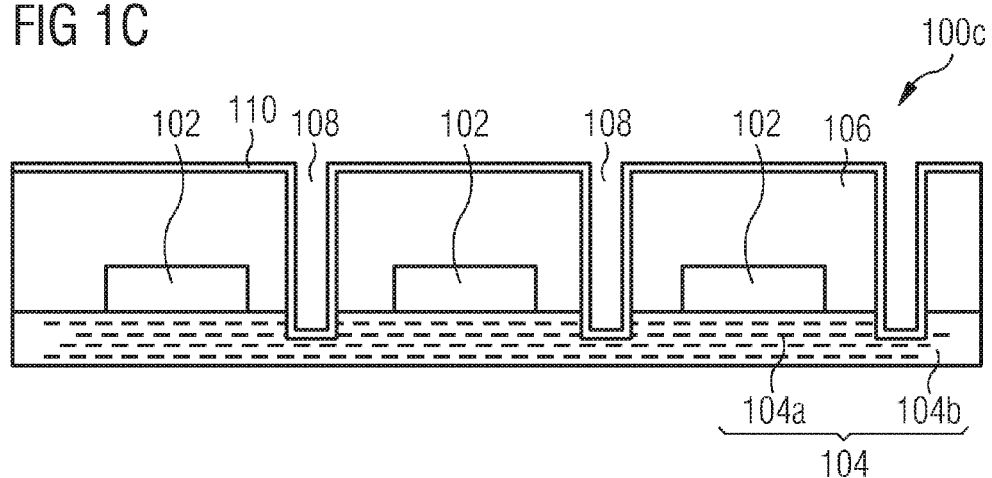
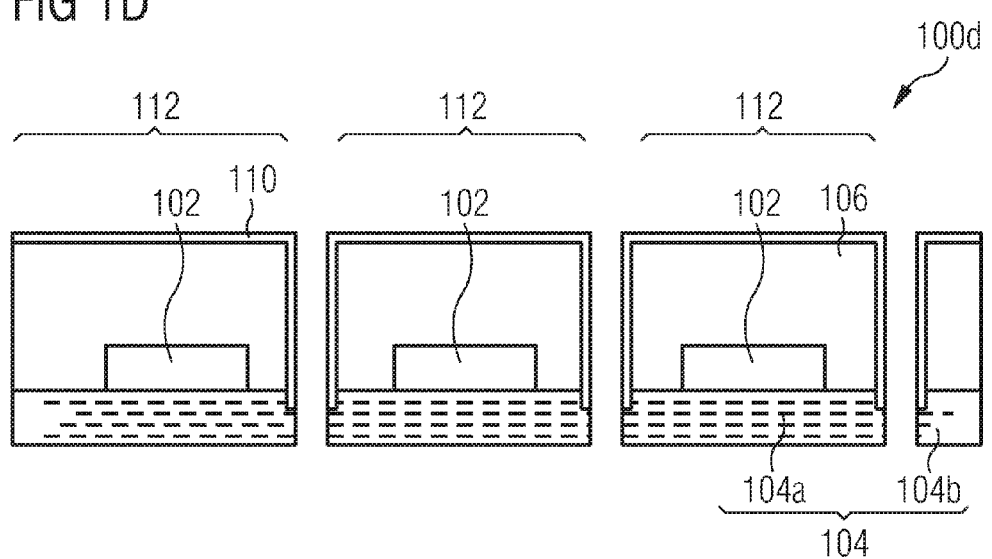

Providing at least one chip — 302

Encapsulating at least partially the chip with encapsulation material — 304

Forming a redistribution structure over a first side of the chip — 306

Forming a metal structure over a second side of the chip, wherein the second side is opposite the first side — 308

Forming at least one of a semiconductor structure and an electrically conductive plastic structure electrically coupled to the redistribution layer and the metal structure to form a current path between the redistribution structure and the metal structure — 310

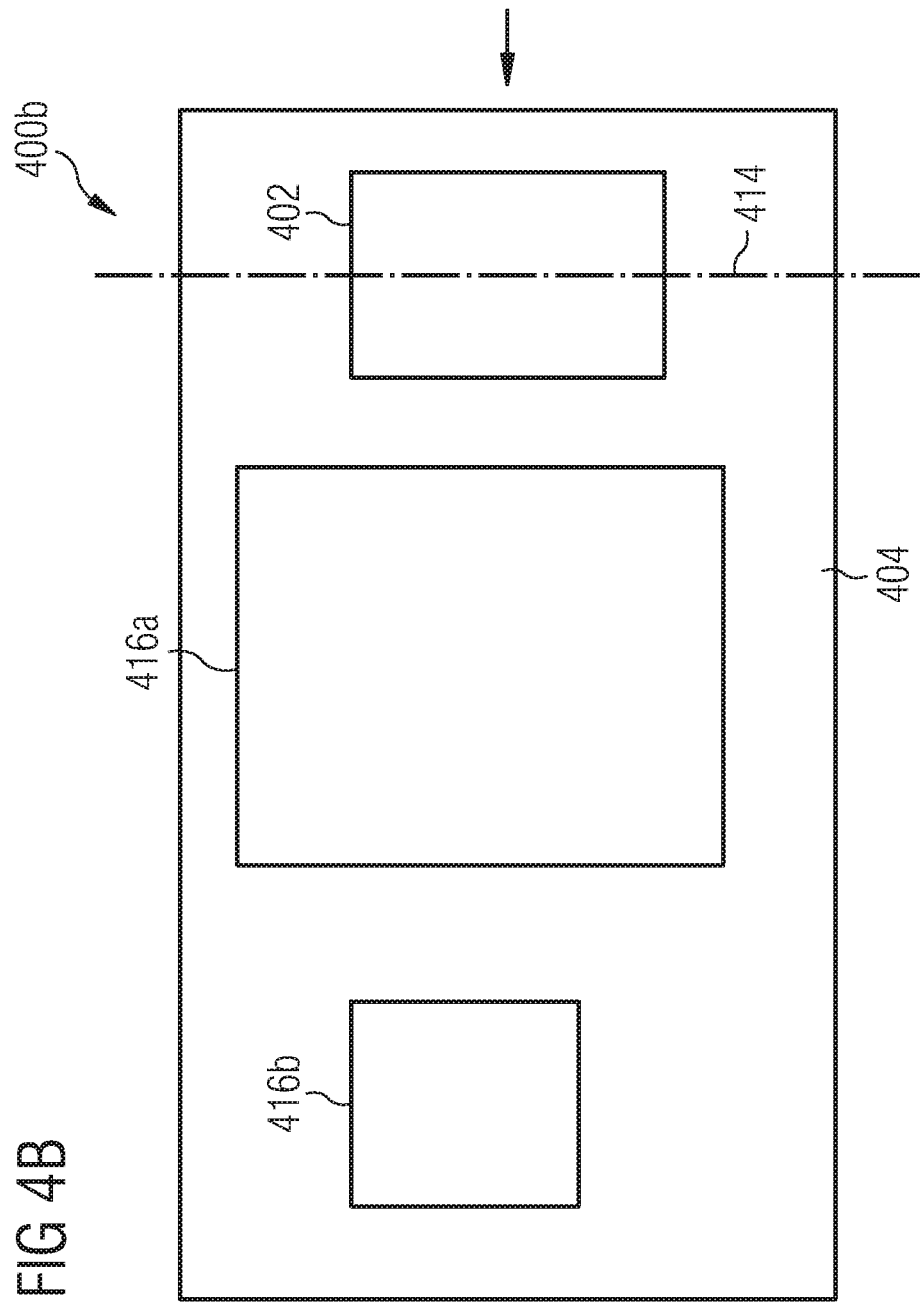

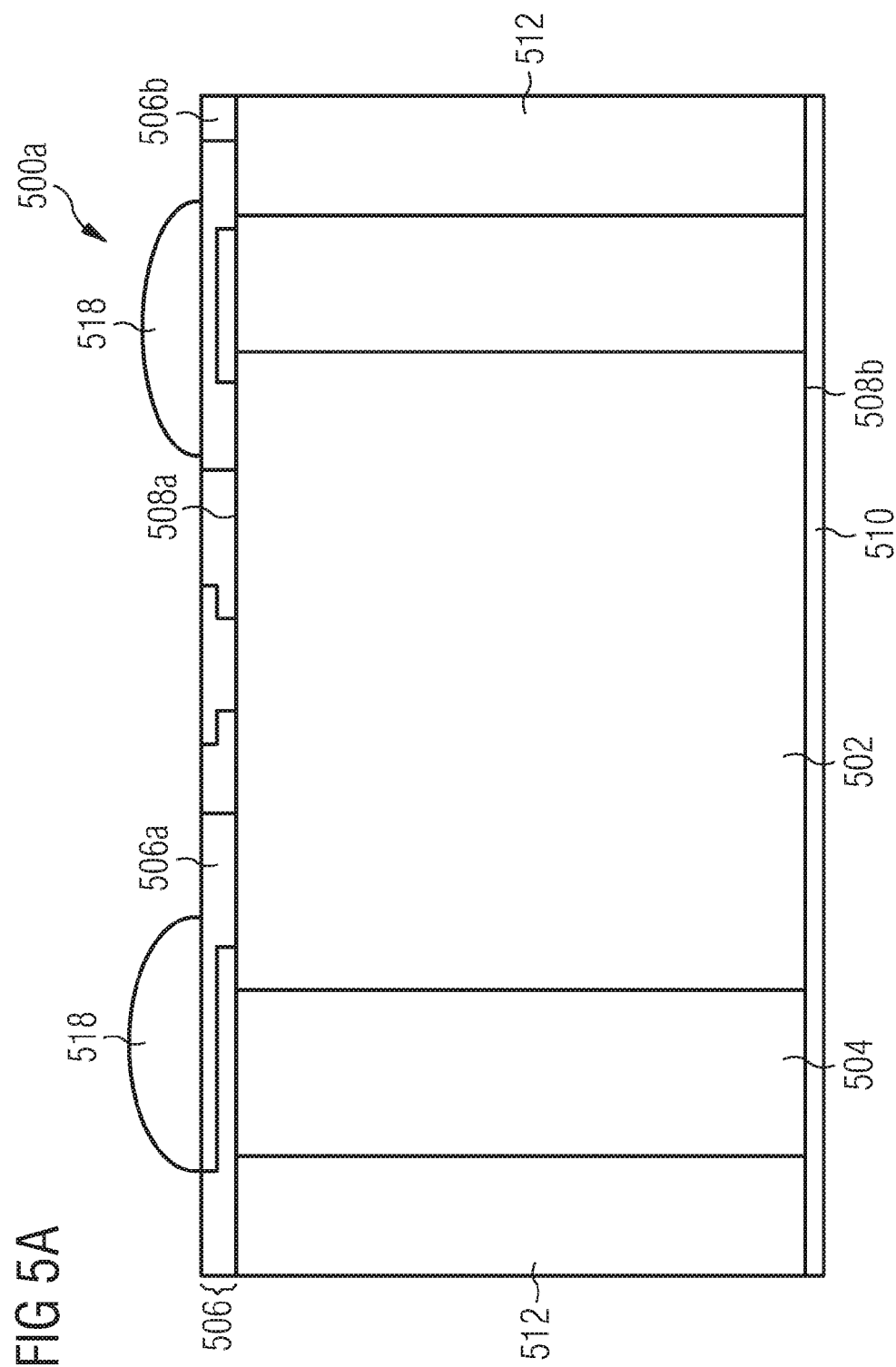

PACKAGE ARRANGEMENT INCLUDING EXTERNAL BLOCK COMPRISING SEMICONDUCTOR MATERIAL AND ELECTRICALLY CONDUCTIVE PLASTIC MATERIAL

TECHNICAL FIELD

Various embodiments relate generally to package arrangements and methods of forming the same.

BACKGROUND

Semiconductor chips often require a shield for protection against electromagnetic interference. Shielding from electromagnetic interference is required especially for many radio frequency applications.

One way is to use the semiconductor substrate beneath the active device or structure for shielding in chip scale packages. However, this approach may not be suitable since there may be strong electromagnetic interference or since the active device or structure may be very sensitive to electromagnetic interference.

Another way is to form a metal cover at the printed circuit board (PCB) level over the devices. The metal cover may be formed for instance by spray coating with conductive ink (on a carbon base or a silver base) or by physical vapor deposition.

FIGS. 1A to 1D show a method of forming a package such as a ball grid array. FIG. 1A is a schematic 100a showing a cross sectional view of semiconductor chips 102 being arranged on a substrate 104 which may include a routing structure. The routing structure may include multiple layers of metallization 104a separated from one another by dielectric layers 104b. Molding material 106 may be deposited onto the semiconductor chips 102. FIG. 1B is a schematic 100b showing a cross sectional view of the structure formed in FIG. 1A being pre-diced. Dicing trenches 108 may be formed to expose a portion of the metallization 104a (e.g. the ground contacts). FIG. 1C is a schematic 100c showing a cross sectional view of the structure formed in FIG. 1B being coated with a shielding layer 110. FIG. 1D is a schematic 100d showing a cross sectional view of the structure formed in FIG. 1C being singulated to form a plurality of package arrangements 112.

SUMMARY

In various embodiments, a package arrangement may be provided. The package arrangement may include at least one chip. The package arrangement may further include encapsulation material at least partially encapsulating the chip. The package arrangement may also include a redistribution structure over a first side of the chip. The package arrangement may further include a metal structure over a second side of the chip. The second side may be opposite the first side. The package arrangement may additionally include at least one of a semiconductor structure and an electrically conductive plastic material structure electrically coupled to the redistribution structure and the metal structure to form a current path between the redistribution structure and the metal structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method of forming a package such as a ball grid array; wherein FIG. 1A shows a cross sectional view of semiconductor chips being arranged on a substrate which may include a fiber core and routing layers and; wherein FIG. 1B shows a cross sectional view of the structure formed in FIG. 1A being pre-diced; wherein FIG. 1C shows a cross sectional view of the structure formed in FIG. 1B being coated with a shielding layer; and wherein FIG. 1D shows a cross sectional view of the structure formed in FIG. 1C being singulated to form a plurality of package arrangements;

FIG. 3 shows a method of forming a package arrangement according to various embodiments;

FIG. 4B shows a planar view of a package arrangement according to various embodiments;

FIG. 5A shows a cross sectional side view of a package arrangement according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1A:
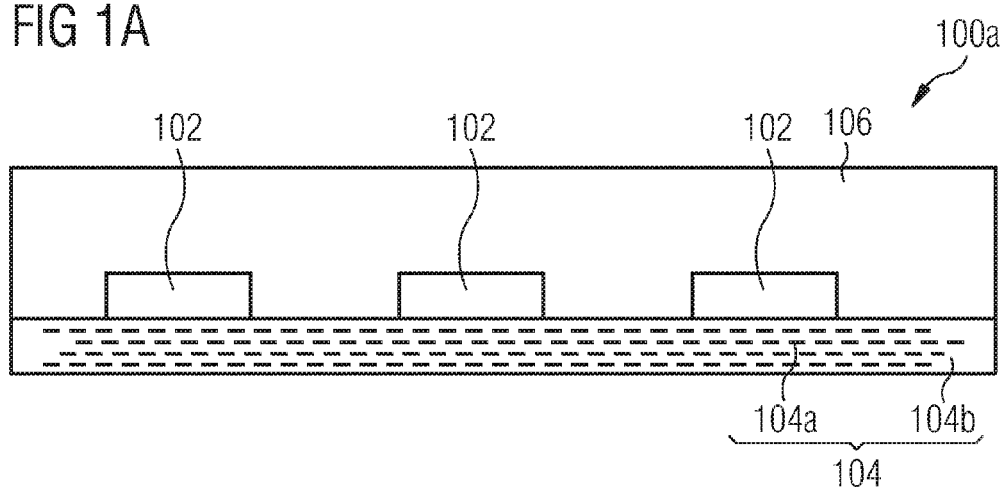
Figure 1B:
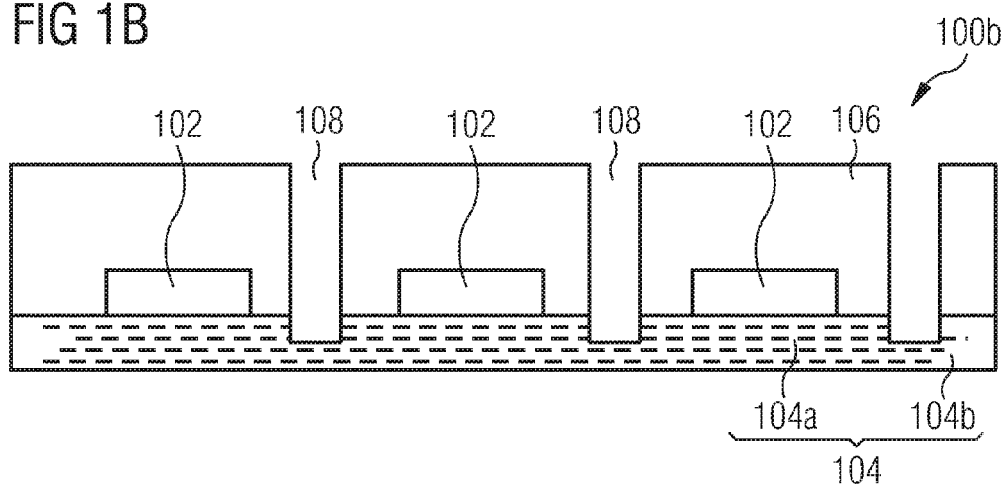
Figure 2:
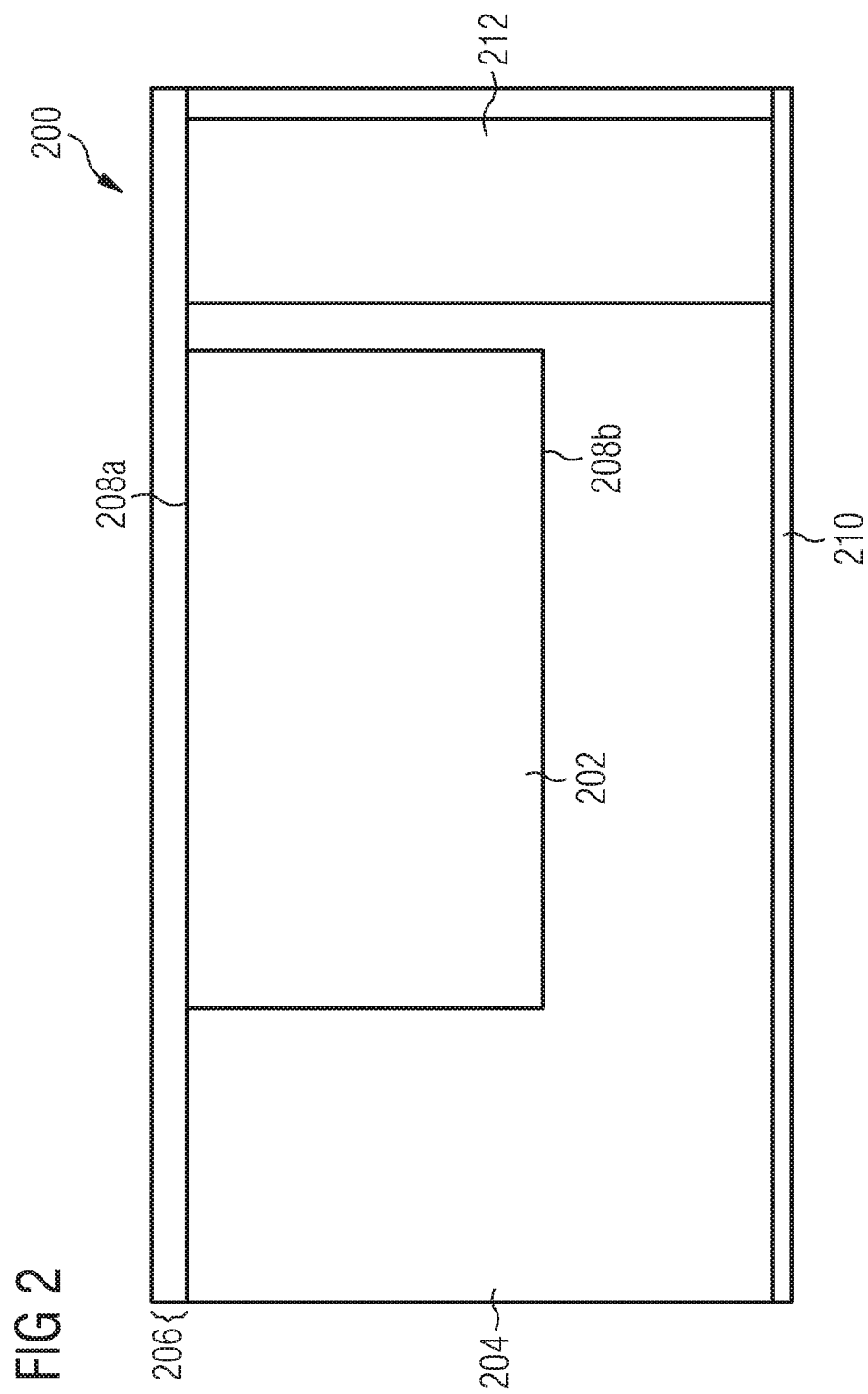
FIG. 2 shows a cross sectional side view of a package arrangement according to various embodiments.

FIG. 2 is a schematic 200 showing a cross sectional side view of a package arrangement according to various embodiments. In various embodiments, a package arrangement may be provided. The package arrangement may include at least one chip 202. The package arrangement may further include encapsulation material 204 at least partially encapsulating the chip 202. The package arrangement may also include a redistribution structure 206 over a first side 208a of the chip 202. The package arrangement may further include a metal structure 210 over a second side 208b of the chip 202. The second side 208b may be opposite the first side 208a. The package arrangement may additionally include at least one of a semiconductor structure and an electrically conductive plastic material structure 212 electrically coupled to the redistribution structure 206 and the metal structure 210 to form a current path between the redistribution structure 206 and the metal structure 210.

In other words, the package arrangement may include at least one chip 202 encapsulated at least partially by the encapsulation material 204. The chip 202 may have a first side 208a and a second side 208b. The package arrangement may further include a redistribution structure 206 over the first side 208a of the chip 202. The package arrangement may also include a metal structure 210 over the second side 208b of the chip 202. The package arrangement may further include a connecting structure electrically coupling the redistribution structure 206 to the metal structure 210. The connecting structure 212 may be a semiconductor structure and/or an electrically conductive plastic material structure.

Various embodiments may be configured to provide an electromagnetic shield which is easy to handle on wafer level and may be diced easily by means of sawing or dicing.

In various embodiments, the package arrangement may be or may include an embedded device package such as an embedded wafer level ball grid array (eWLB).

In various embodiments, the connecting structure 212 may not be required to be sawn or diced during the manufacturing process. In various embodiments, the connecting structure 212 may include material that are easily sawn or diced during the manufacturing process.

The encapsulating material 204 may include a mold compound. Encapsulation material 204 at least partially encapsulating the chip 204 may include the encapsulation material 204 at least partially covering the chip 204.

In various embodiments, the redistribution structure 206 may include a multi-layer structure. The redistribution structure 206 may include one or more metallization layers or interconnects. The metallization layers or interconnects may include an electrically conductive material such as e.g. a metal such as e.g. copper or aluminum. The metallization layers or interconnects may be configured for current redistribution. In other words, the metallization layer or interconnects may serve as or be configured as one or more redistribution layers (RDLs). The redistribution structure 206 may further include one or more dielectric or insulating material/layers such as polymer (e.g. polyimide, epoxy, silicone, ormocere etc) or silicon oxide. The metallization layers (or interconnects) may be separated from one another by the dielectric (or insulating) layers. The redistribution structure 206 may include a laminate. The redistribution structure 206 may include a glass fibre core, for example.

The redistribution structure 206 may have a thickness in a range from about 5 μm to about 1000 μm, e.g. from about 10 μm to about 200 μm.

The multi-layer structure may include a thin-film multi-layer structure. The redistribution structure 206 may include one or more thin film metallization layers. The redistribution structure 206 may also include one or more thin film dielectric or insulating layers. The thin film metallization layers may be separated from one another by the dielectric (or insulating) layers. Each thin-film layer may have a thickness below about 50 μm, e.g. below about 15 μm e.g. from about 0.5 μm to about 10 μm.

The redistribution structure 206 may be coupled to a reference potential. The chip 202 may provide the reference potential. The distribution structure 206 may be electrically coupled to the chip 202. The reference potential may be at ground.

The metal structure 210 may be configured as an electromagnetic shield such as a radio frequency shielding structure. The metal structure 210 may be electrically coupled to the chip 202 via the redistribution structure 206 and the connecting structure 212. The metal structure may be also coupled to the reference potential. The metal structure 210 may include metal or conductive ink or any electrically conductive material.

The package arrangement may have a first side and a second side opposite the first side. The first side of the package arrangement may face the same direction as the first side of the chip 202. The second side of the package arrangement may face the same direction as the second side of the chip 202. In various embodiments, the first side of the chip 202 may coincide and lie along the first side of the package arrangement. In various embodiments, the second side of the chip 202 may coincide and lie along the second side of the package arrangement. In various embodiments, the chip 202 may extend through the entire thickness of the package arrangement. In various alternate embodiments, the chip 202 may extend partially through the entire thickness of the package arrangement. The package arrangement may include encapsulation material between the metal structure 210 and the chip 202.

In various embodiments, the metal structure 210 covers the entire second side of the package arrangement. In various embodiments, the redistribution structure 206 may cover the entire first side of the package arrangement.

The connecting structure 212 may be at least one of the semiconductor structure and an electrically conductive plastic material structure. In various embodiments, the at least one of the semiconductor structure and the electrically conductive plastic material structure may include at least one block external from the chip 202. The at least one block may include at least one of semiconductor material and electrically conductive material. The at least one block may be arranged next to or adjacent the chip 202. In various alternate embodiments, the at least one block may be arranged in a portion of the package arrangement remote from the chip 202. The at least one block may at least partially be arranged in an edge region of the package arrangement. The at least one block may be partially exposed in the package arrangement. The at least one block may form at least partially one lateral side of the package arrangement.

The at least one block may be at least partially arranged in corner regions of the package arrangement. The at least one block may form at least partially a first lateral side and a second lateral side of the package arrangement. The first lateral side may be substantially perpendicular to the second lateral side. Arranging the at least one block in an edge region or a corner region may help to form a "quasi" Faraday box. In other words, arranging blocks along the edges or in corners of the package arrangement may further help to provide electromagnetic shielding to the chip 202. In various embodiments, the at least one block may be configured to be diced or sawn. Dicing or sawing through the at least one block may be easier than sawing or dicing through embedded metal blocks, thick metallization layers or interconnects.

The at least one block may include a plurality of blocks. The blocks of the plurality of blocks may be arranged in respective corner regions of the package arrangement. Each block may provide for a plurality of chips (e.g. adjacent chips). In other words, each block may be electrically coupled to a plurality of chips via the redistribution layer. Each block may be separated from another block by a distance smaller than 1/10 of a wavelength, e.g. smaller than 1/20 of a wavelength, of the irradiation or electromagnetic radiation which the package arrangement is configured to be shielded against. For electromagnetic radiation or irradiation of about 60 GHz, a distance of about 0.25 mm between blocks may be suitable, for example.

The semiconductor structure may instead be part of the chip 202. The chip 202 may electrically couple the redistribution structure 206 and the metal structure 210 to form the current path between the redistribution structure 206 and the metal structure 210. The semiconductor structure may be formed by an active area of the chip 202. The active area of the chip 202 may include low ohmic passive silicon such as monocrystalline silicon, polycrystalline silicon or solar grade silicon. The active area of the chip 202 may additionally or alternatively include other semiconductor materials such as gallium arsenide (GaAs) or gallium nitride (GaN). The silicon and/or other semiconductor material may be doped. The chip 202 may, alternatively or additionally, include a through via or a series of vias to electrically couple the redistribution structure 206 and the metal structure 210. The package arrangement may additionally include at least one block external from the chip 202.

In various embodiments, the semiconductor structure may be in physical contact with at least one of the redistribution structure 206 and the metal structure 210. The semiconductor structure may be in physical contact with the redistribution structure 206 and the metal structure 210.

The semiconductor structure may have a resistivity in the μΩcm to mΩcm range, e.g. from about 1 μΩcm to about 1 mΩcm.

The semiconductor structure may include silicon. The semiconductor material may include silicon. The silicon may be selected from a group consisting of monocrystalline silicon, polycrystalline silicon and amorphous silicon. Alternatively or additionally, the semiconductor structure (or the semiconductor material) may include gallium arsenide (GaAs) or gallium nitride (GaN). The semiconductor structure may have a sole function of electrically coupling the redistribution structure 206 and the metal structure 210 and may include a semiconductor material with high defect density such as solar grade silicon. Using a semiconductor material without requiring the need to minimize defect density may lower manufacturing costs.

The electrically conductive plastic material structure may include a plastic material with carbon black. The electrically conductive plastic material structure (or electrically conductive material) may include organic polymers that conduct electricity. The electrically conductive plastic material structure (or electrically conductive material) may include polymers with aromatic cycle chains such as polypyrroles (PPYs) and polythiophenes (PTs), polymers with double bonds such as polyacetylenes (PACs) or polymers with aromatic cycles and double bonds such as poly(p-)phenylene vinylene (PPVs). The electrically conductive plastic material structure may have a resistivity from about $10^{-4}$ Ωcm to about $10^{-3}$ mΩcm.

In various embodiments, the at least one chip 202 may include a plurality of chips. The encapsulation material 204 may at least partially encapsulate the plurality of chips 202. The at least one of a semiconductor structure and an electrically conductive plastic material structure 212 may include at least one block external from the chip 202. The at least one block may include at least one of semiconductor material and electrically conductive plastic material. The block may be shared by the plurality of chips to form a plurality of current path for a respective chip 202.

In various embodiments, the at least one chip 202 may include a plurality of chips. The redistribution structure 206 may be only over certain portions of the first side of the package arrangement. The metal structure 210 may be over certain portions of the second side of the package arrangements. The redistribution structure 206 may be discontinuous and may include a plurality of redistribution structure segments. The metal structure 210 may be discontinuous and many include a plurality of metal structure segments. Portions of the package arrangement may be free of redistribution structure segments or metal structure segments so that lines substantially perpendicular to the plane of the package arrangement may not cut through the redistribution structure segments or the metal structure segments. The lines may also not cut through the chips. The lines may be configured to be dicing lines such that when the package arrangement is diced or sawn, the redistribution structure segments or the metal structure segments or the chips 202 may not be diced or sawn.

FIG. 3 shows a schematic 300 showing a method of forming a package arrangement according to various embodiments. The method may include, in 302, providing at least one chip. The method may also include, in 304, encapsulating at least partially the chip with encapsulation material. The method may further include, in 306, forming a redistribution structure over a first side of the chip. The method may also include, in 308, forming a metal structure over a second side of the chip. The second side may be opposite the first side. The method may include, in 310, forming at least one of a semiconductor structure and an electrically conductive plastic material structure electrically coupled to the redistribution layer and the metal structure. Semiconductor material of the semiconductor structure and/or electrically conductive plastic material of the electrically conductive plastic structure form a current path between the redistribution structure and the metal structure.

In other words, the method may include encapsulating at least partially at least one chip with encapsulation material. The chip may have a first side and a second side opposite the first side. The method may also include forming a redistribution structure over the first side of the chip. In addition, the method may include forming a metal structure over the second side of the chip. A connecting structure may be formed to electrically couple the redistribution layer and the metal structure. The connecting structure be a semiconductor structure and/or an electrically conductive plastic structure.

Various embodiments may be configured to provide a method of forming an electromagnetic shield. The method may reduce or avoid dicing or sawing through metal blocks.

Encapsulating the chip may include using a molding process. Encapsulating the chip may include bringing a mold to or over the chip such that at least one mold cavity is formed between the mold and the chip. The process may also include heating the encapsulation material such as a mold compound until it is liquefied. The process may further include flowing the liquefied encapsulation material such as the mold compound into the at least one mold cavity. In addition, the process may include allowing the liquefied encapsulation material (e.g. mold compound) to solidify under elevated temperature and pressure such that the chip is encapsulated by the encapsulation material (e.g. mold compound).

The process may include bringing a mold to or over the chip. Additionally, a further mold may be provided below the chip such that at least one mold cavity can be formed between the two molds and the chip. The process may also include having a film between the mold and the chip. The film may cover the inner surface of the mold within the mold cavity. A further film may also be provided between the further mold and the chip. The further film may cover the inner surface of the further mold within the mold cavity. The process may also include heating the encapsulation material such as a mold compound until it is liquefied. The process may further include flowing the liquefied encapsulation material such as the mold compound into the at least one mold cavity. In addition, the process may include allowing the liquefied encapsulation material (e.g. mold compound) to solidify under elevated temperature and pressure such that the chip is encapsulated by the encapsulation material (e.g. mold compound). Encapsulating the chip with the encapsulation material may include encapsulating the chip with the encapsulation material using a film assisted molding process.

In various embodiments, the redistribution structure may include a multi-layer structure. The redistribution structure may include one or more metallization layers or interconnects. The metallization layers or interconnects may include a conductive material or a metal such as e.g. titanium (Ti), copper (Cu) or aluminum (Al). The metallization layers or interconnects may be configured for current redistribution. In other words, the metallization layer or interconnects may serve as redistribution layers (RDLs). The redistribution structure may further include one or more dielectric or insulating layers/material such as polymer or silicon oxide. The metallization layers (or interconnects) may be separated from one another by the dielectric (or insulating) layers. The redistribution structure may include a laminate. The redistribution structure may include a glass fibre core.

In various embodiments, forming the redistribution structure may include a suitable deposition technique such as physical vapor deposition or chemical vapor deposition. Forming the redistribution structure may include a photolithography process and/or a lift off process. For instance, forming the redistribution structure may include depositing a resist material and patterning the resist material using photolithography followed by electro plating, stripping the resist material and seed. A dielectric material such as silicon oxide may be deposited followed by lift-off to form the first dielectric layer. A first metallization layer or interconnects may then be formed over the first dielectric layer.

In various embodiments, the redistribution structure may be formed after encapsulating the chip. In various alternate embodiments, the redistribution layer may be formed before encapsulating the chip.

The redistribution structure may have a thickness in a range from about 5 μm to about 1000 μm, e.g. from about 10 μm to about 200 μm.

The multi-layer structure may include a thin-film multi-layer structure. The redistribution structure may include one or more thin film metallization layers. The redistribution structure may also include one or more thin film dielectric or insulating layers. The thin film metallization layers may be separated from one another by the dielectric (or insulating) layers. Each thin-film layer may have a thickness below about 20 μm, e.g. below about 15 μm e.g. from about 5 μm to about 10 μm.

The redistribution structure may be coupled to a reference potential. The chip may provide the reference potential. The redistribution structure may be electrically coupled to the chip. The reference potential may be at ground.

The metal structure may be configured as an electromagnetic shield such as a radio frequency shielding structure. The metal structure may be electrically coupled to the chip via the redistribution structure and the connecting structure. The metal structure may be also coupled to the reference potential.

Forming the metal structure may include a suitable deposition technique such as physical vapor deposition or chemical vapor deposition. Forming the metal structure may alternately include spraying conductive ink or using "plasma dust deposition".

The package arrangement may have a first side and a second side opposite the first side. The first side of the package arrangement may face the same direction as the first side of the chip. The second side of the package arrangement may face the same direction as the second side of the chip. In various embodiments, the first side of the chip may coincide and lie along the first side of the package arrangement. In various embodiments, the second side of the chip may coincide and lie along the second side of the package arrangement. In various embodiments, the chip may extend through the entire thickness of the package arrangement. In various alternate embodiments, the chip may extend partially through the entire thickness of the package arrangement. The package arrangement may include encapsulation material between the metal structure and the chip.

In various embodiments, the metal structure covers the entire second side of the package arrangement. In various embodiments, the redistribution structure may cover the entire first side of the package arrangement.

The connecting structure may be at least one of the semiconductor structure and an electrically conductive plastic material structure. In various embodiments, the at least one of the semiconductor structure and the electrically conductive plastic material structure may include at least one block external from the chip. The at least one block may include at least one of semiconductor material and electrically conductive material.

Forming the at least one block may include locally removing encapsulation material of from the package arrangement such as etching or drilling. Forming the at least one block may include subsequently depositing the at least one of semiconductor material and electrically conductive plastic material. Forming the at least one block may instead include depositing the at least one of semiconductor material and electrically conductive plastic material on one or more lateral sides of the package arrangement. The depositing of at least one of semiconductor material and electrically conductive plastic material may be carried out before or after dicing or sawing.

The at least one block may be arranged next to or adjacent the chip. In various alternate embodiments, the at least one block may be arranged in a portion of the package arrangement remote from the chip. The at least one block may at least partially be arranged in an edge region of the package arrangement. The at least one block may be partially exposed in the package arrangement. The at least one block may form at least partially one lateral side of the package arrangement. The at least one block may be at least partially arranged in corner regions of the package arrangement. The at least one block may form at least partially a first lateral side and a second lateral side of the package arrangement. The first lateral side may be substantially perpendicular to the second lateral side.

The at least one block may include a plurality of blocks. The blocks of the plurality of blocks may be arranged in respective corner regions of the package arrangement. Each block may provide for a plurality of chips (e.g. adjacent chips). In other words, each block may be electrically coupled to a plurality of chips via the redistribution layer.

The semiconductor structure may instead be part of the chip. The chip may electrically couple the redistribution structure and the metal structure to form the current path between the redistribution structure and the metal structure. The semiconductor structure may be formed by an active area of the chip. The package arrangement may additionally include at least one block external from the chip.

In various embodiments, the semiconductor structure may be in physical contact with at least one of the redistribution structure and the metal structure.

The semiconductor structure may have a resistivity in the μΩcm to mΩcm range, e.g. from about 1 μΩcm to about 1 mΩcm.

The semiconductor structure may include silicon. The semiconductor material may include silicon. The silicon may be selected from a group consisting of monocrystalline silicon, polycrystalline silicon and amorphous silicon. Alternatively or additionally, the semiconductor structure (or the semiconductor material) may include gallium arsenide (GaAs) or gallium nitride (GaN). The semiconductor structure or semiconductor material may be doped. The chip may alternatively or additionally include a through via or a series of vias to electrically couple the redistribution structure and the metal structure. Forming the through via or series of vias may include etching such as deep reactive ion etching. Forming the through via or series of vias may subsequently include deposition of a conductive material such as semiconductor material or metal into the etched holes.

The electrically conductive plastic material structure may include a plastic material with carbon black. The electrically conductive plastic material structure (or electrically conductive material) may include organic polymers that conduct electricity. The electrically conductive plastic material structure (or electrically conductive material) may include polymers with aromatic cycle chains such as polypyrroles (PPYs) and polythiophenes (PTs), polymers with double bonds such as polyacetylenes (PACs) or polymers with aromatic cycles and double bonds such as poly(p-phenylene vinylene) (PPVs). The electrically conductive plastic material structure may have a resistivity from about $10^{-4}$ Ωcm to about $10^{-3}$ mΩcm.

In various embodiments, the at least one chip may include a plurality of chips. The encapsulation material may at least partially encapsulate the plurality of chips. The at least one of a semiconductor structure and an electrically conductive plastic material structure may include at least one block external from the chip. The at least one block may include at least one of semiconductor material and electrically conductive plastic material. The block may be shared by the plurality of chips to form a plurality of current path for a respective chip.

In various embodiments, the at least one chip may include a plurality of chips. The redistribution structure may be only over certain portions of the first side of the package arrangement. The metal structure may be over certain portions of the second side of the package arrangements. The redistribution structure may be discontinuous and may include a plurality of redistribution structure segments. The metal structure may be discontinuous and may include a plurality of metal structure segments. Portions of the package arrangement may be free of redistribution structure segments or metal structure segments so that lines substantially perpendicular to the plane of the package arrangement may not cut through the redistribution structure segments or the metal structure segments. The lines may also not cut through the chips. The lines may be configured to be dicing lines such that when the package arrangement is diced or sawn, the redistribution structure segments or the metal structure segments or the chips may not be diced or sawn.

In various embodiments, the metal structure may be formed before the at least one of a semiconductor structure and an electrically conductive plastic structure may be formed.

In various other embodiments, the metal structure may be formed after the at least one of a semiconductor structure and an electrically conductive plastic structure may be formed. In various embodiments, the package arrangement may be thinned (e.g. using grinding) before forming the metal structure. The metal structure formed may be "free of charge" when no or little processing is involved in the processing of the side of the package arrangement (i.e. the second side of the package arrangement) over which the metal structure is formed.

In various embodiments, the method may include encapsulating at least partially a plurality of chips with encapsulation material. The method may also include forming a redistribution structure over a first side of the chips. The method may further include attaching the encapsulated chips to a temporary substrate such as a carrier or a dicing tape. The method may include dicing or sawing the encapsulated chips to form package arrangements. Each package arrangement may include one chip. The method may include forming a metal structure over each a second side of each chip. The metal structure may extend to a lateral side of each package arrangement to electrically couple a conductive structure or to form a conductive structure. The conductive structure may be configured for electrically coupling between the metal structure and the redistribution layer. The conductive structure may be a semiconductor structure. The conductive structure may also instead be an electrically conductive plastic material structure. The distance between the redistribution structure and the metal structure of each package arrangement may be small e.g. about 1 μm to about 100 μm.

Figure 4A:
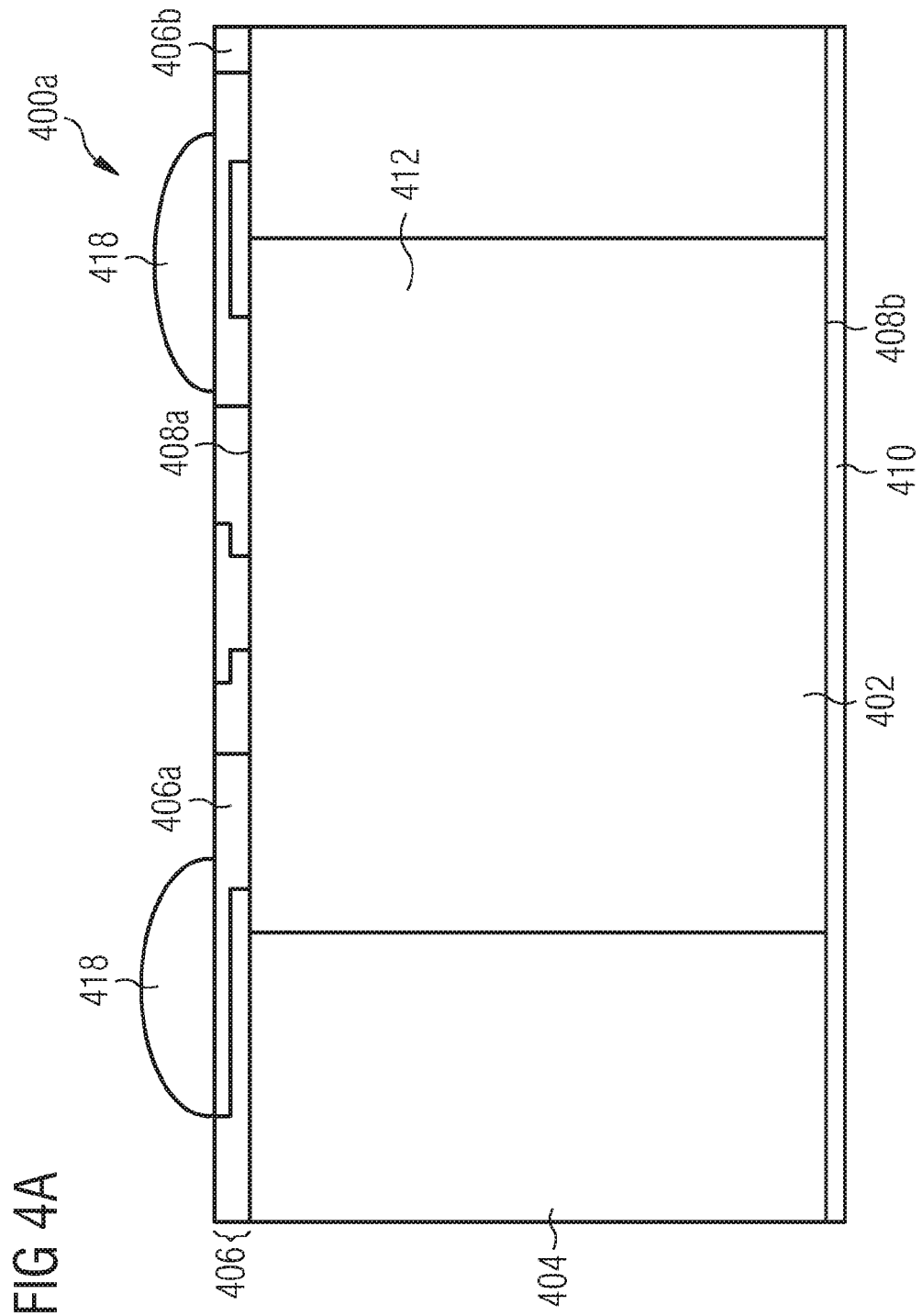
FIG. 4A shows a cross sectional side view of a package arrangement according to various embodiments.

FIG. 4A is a schematic 400a showing a cross sectional side view of a package arrangement according to various embodiments. FIG. 4B is a schematic 400b showing a planar view of a package arrangement according to various embodiments. The line 414 in FIG. 4B may correspond to FIG. 4A when viewed from one side indicated by the arrow in FIG. 4B. The redistribution structure 406 is not shown in FIG. 4B.

In various embodiments, a package arrangement may be provided. The package arrangement may include at least one chip 402. The package arrangement may further include encapsulation material 404 at least partially encapsulating the chip 402. The package arrangement may also include a redistribution structure 406 over a first side 408a of the chip 402. The package arrangement may further include a metal structure 410 over a second side 408b of the chip 402. The second side 408b may be opposite the first side 408a. The package arrangement may additionally include a semiconductor structure 412 (which may include or be formed of bulk semiconductor material) electrically coupled to the redistribution structure 406 and the metal structure 410 to form a current path between the redistribution structure 406 and the metal structure 410.

The chip 404 may be or include a transistor. For example, the chip 404 may be or include a metal oxide field effect transistor (MOSFET) such as a power MOSFET. The chip 404 may alternatively or additionally be or include a bipolar transistor such as an insulated gate bipolar transistor (IGBT). The chip 404 may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The chip 404 may include additional or alternatively include a capacitor, an inductor, a resistor or any other electrical components.

The chip 402 may have a first side 408a and a second side 408b opposite of the first side 408a. The chip 402 may extend through the entire thickness of the package arrangement. The package arrangement may have a first side and a second side opposite the first side. The first side 408a of the chip may be along the same plane as the first side of the package arrangement. The second side 408b of the chip may be along the same plane as the second side of the package arrangement.

The redistribution structure may include metallization or interconnects 406a embedded or at least be partially covered by dielectric or insulating material 406b. The redistribution structure 406 may include a multi-layer structure. In other words, the redistribution structure 406 may include more than one layer of metallization or interconnects and more than one layer of dielectric or insulating material. A first layer of metallization or interconnects may be electrically coupled to a second layer of metallization or interconnects using conductive vias. The multi-layer structure may include a laminate. The multi-layer structure may include a thin-film multi-layer structure.

The chip 402 may be electrically coupled to the redistribution structure 406. The chip 402 may include one or more electrical contacts for electrically coupling to the redistribution structure 406.

The chip 402 may be configured to be electrically coupled to an external device or carrier. The chip 402 may be configured to be electrically coupled to the external device or carrier via the redistribution layer 406. Solder contacts 418 may be used for electrically coupling the chip to the external device or carrier.

The metal structure 410 may be configured as a radio frequency shielding structure. As seen in FIG. 4A, the metal structure may cover the entire second side of the package arrangement. In various alternate embodiments, the metal structure may cover a portion of the second side of the package arrangement.

The semiconductor structure 412 (which may include or be formed of bulk semiconductor material) may be part of the chip 402. The semiconductor structure 412 may be formed by an active area of the chip 402. The chip 402 may include a semiconductor structure 412 that provides electrical coupling through the chip 402 between the first side 408a of the chip 402 and the second side 408b of the chip 402. The semiconductor structure 412 may include silicon or any other suitable semiconductor material. The silicon may include silicon selected from a group consisting of monocrystalline silicon, polycrystalline silicon and amorphous silicon. The semiconductor structure 412 may be doped with dopants for increasing the conductivity of the semiconductor structure 412. The semiconductor structure 412 may additionally or alternatively a through via or a series of vias for electrical coupling between the redistribution structure 406 and the metal structure 410. The semiconductor structure may be in physical contact with at least one of the redistribution structure 406 and the metal structure 410. Illustratively, the active area may physically couple to the redistribution structure 406 and to the metal structure 410.

The package arrangement may further include one or more optional components 416a and/or 416b. The optional components 416a, 416b may include active components such as transistors such as a metal oxide field effect transistor (MOSFET) or a bipolar junction transistor. The optional components may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The optional components 416a, 416b may include passive components such as a capacitor, an inductor, a resistor or a filter network.

The optional component 416a, 416b may also include for instance a microelectromechanical system (MEMs) structure or a sensor (e.g. acceleration device, a gyro-devices, a switch, a Baw device or a Saw device, etc.) or a photonic structure or a solar cell. The optional component 415a, 416b may be electrically coupled to the chip 402. Electrically coupling between the chip 402 and the optional components may be via the redistribution structure 406.

The optional component 416a, 416b may include instead at least one block external from the chip 402. The at least one block may include at least one of semiconductor material and electrically conductive plastic material.

In various embodiments, the method may include encapsulating one or more chips 402 with encapsulation material 412. Each chip 402 may have a first side 408a and a second side 408b. Each chip 402 may include a semiconductor structure 412 that provides electrical coupling through the chip 402 between the first side 408a of the chip 402 and the second side 408b of the chip 402. The redistribution structure 406 may be formed over the first side 408a of the one or more chips either before encapsulating the one or more chips 402 or after encapsulating the one or more chips 402. The redistribution structure 406 may be electrically coupled to the semiconductor structure 412. The method may further include forming a metal structure 410 over the second side 408b of the one or more chips 402. The encapsulation material may be grinded or removed to expose the second side 408b of the one or more chips 402 before forming the metal structure 410. The metal structure 410 may be electrically coupled to the semiconductor structure 412.

If there are more than one chip, the encapsulated chips may be sawn or diced. Sawing or dicing may be carried out before or after forming the metal structure 410. The redistribution structure 406 or the metallization layers/interconnects 406a of the redistribution structure 406 may cover only partially the entire first side of the package arrangement. The metal structure 410 may cover only partially the entire second side of the package arrangement. The package arrangement may be configured to be diced or sawn along the portions of the package arrangement without metallization layers or interconnects or metal structure. In other words, the redistribution structure 406 may be only over certain portions of the first side of the package arrangement or the distribution structure 406 may be configured such that only the dielectric material 406b is over certain portions of the first side of the package arrangement. The metal structure 410 may be over certain portions of the second side of the package arrangements. The redistribution structure 406 may be discontinuous and may include a plurality of redistribution structure segments. The metal structure 410 may be discontinuous and may include a plurality of metal structure segments. Portions of the package arrangement may be free of redistribution structure segments (or only be covered by dielectric material 406b of the distribution structure 406) or metal structure segments so that lines substantially perpendicular to the plane of the package arrangement may not cut through the redistribution structure segments (metallization layers or interconnects 406a) or the metal structure segments. The lines may also not cut through the chips 402. The lines may be configured to be dicing lines such that when the package arrangement is diced or sawn, the metallization layers or interconnects 406a of the redistribution structure segments or the metal structure segments or the chips 402 may not be diced or sawn.

Figure 5B:
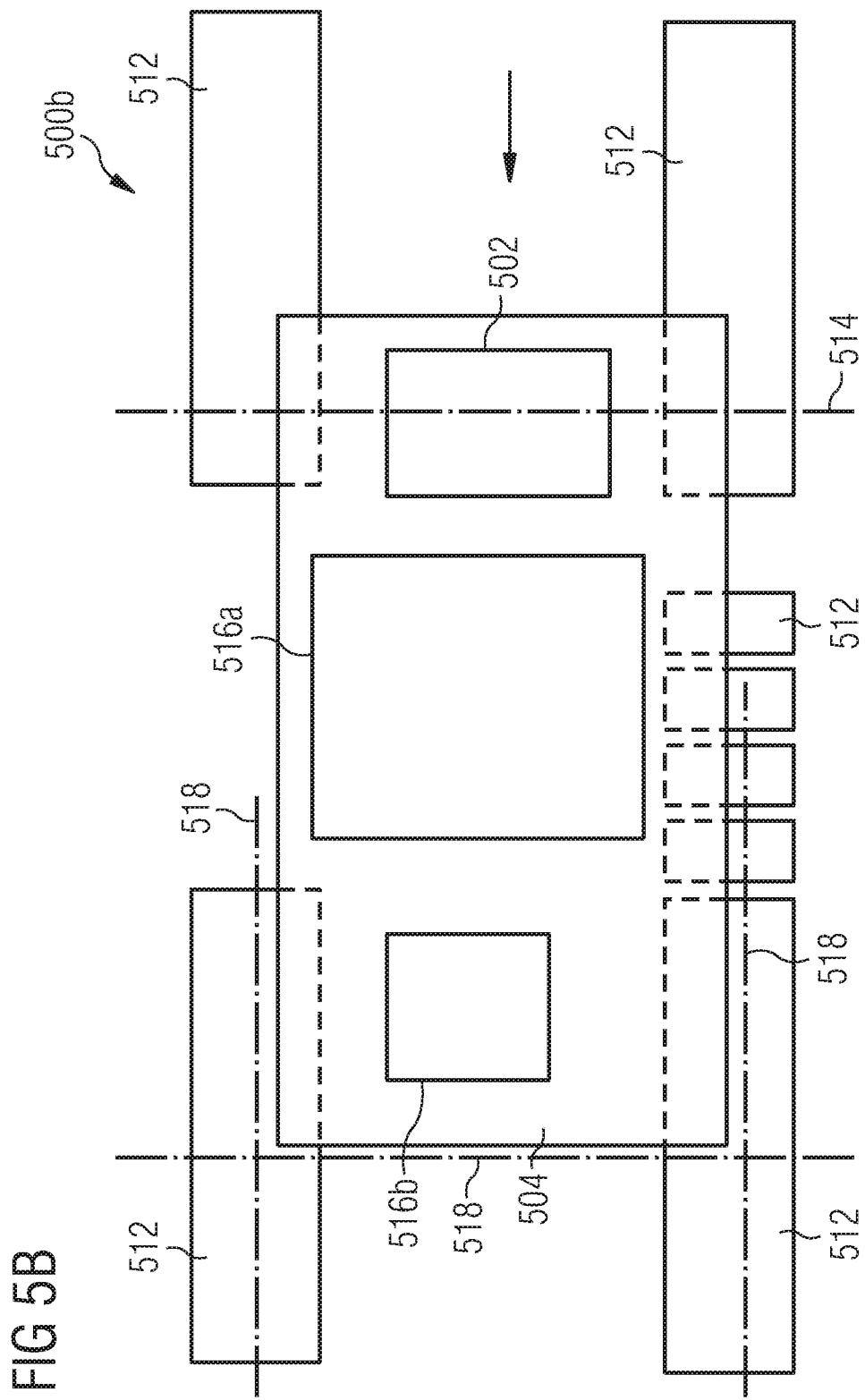
FIG. 5B shows a planar view of a package arrangement according to various embodiments.

FIG. 5A is a schematic 500a showing a cross sectional side view of a package arrangement according to various embodiments. FIG. 5B is a schematic 500b showing a planar view of a package arrangement according to various embodiments. The line 514 in FIG. 5B may correspond to FIG. 5A when viewed from one side indicated by the arrow in FIG. 5B. The redistribution structure 506 is not shown in FIG. 5B.

In various embodiments, a package arrangement may be provided. The package arrangement may include at least one chip 502. The package arrangement may further include encapsulation material 504 at least partially encapsulating the chip 502. The package arrangement may also include a redistribution structure 506 over a first side 508a of the chip 502. The package arrangement may further include a metal structure 510 over a second side 508b of the chip 502. The second side 508b may be opposite the first side 508a. The package arrangement may additionally include at least one of a semiconductor structure and an electrically conductive material structure 512 electrically coupled to the redistribution structure 506 and the metal structure 510 to form a current path between the redistribution structure 506 and the metal structure 510. The conductive material structure 512 may be bare low ohmic Silicon (e.g. solar grade silicon, polycrystalline silicon, etc. or any other semiconductor material).

The chip 502 may be chip like the chip 402 as described above.

The redistribution structure may include metallization or interconnects 506a embedded or at least be partially covered by dielectric or insulating material 506b. The redistribution structure 506 may include a multi-layer structure. In other words, the redistribution structure 506 may include more than one layer of metallization or interconnects and more than one layer of dielectric or insulating material. A first layer of metallization or interconnects may be electrically coupled to a second layer of metallization or interconnects using conductive vias. The multi-layer structure may include a laminate. The multi-layer structure may include a thin-film multi-layer structure.

The chip 502 may be electrically coupled to the redistribution structure 506. The chip 502 may include one or more electrical contacts for electrically coupling to the redistribution structure 506.

The chip 502 may be configured to be electrically coupled to an external device or carrier. The chip 502 may be configured to be electrically coupled to the external device or carrier via the redistribution layer 506. Solder contacts 518 may be used for electrically coupling the chip to the external device or carrier.

The metal structure 510 may be configured as a radio frequency shielding structure. As seen in FIG. 5A, the metal structure may cover the entire second side of the package arrangement. In various alternate embodiments, the metal structure may cover a portion of the second side of the package arrangement.

In various embodiments, the at least one of the semiconductor structure or the electrically conductive material structure 512 may at least include one block external from the chip 502. The at least one block may include at least one of semiconductor material and electrically conductive plastic material. As seen in FIG. 5A and FIG. 5B, the at least one block may be at least partially arranged in an edge region or a corner region of the package arrangement. The at least one block may be arranged at least partially along the perimeter of the package arrangement.

In various embodiments, the at least one block may include a plurality of blocks. The blocks of the plurality of blocks may be arranged in respective corner regions of the package arrangement.

The package arrangement may further include one or more optional components 516a and/or 516b which may be configures as the one or more optional components 416a and/or 416b as described above.

In various embodiments, the method may include encapsulating one or more chips 502 with encapsulation material 504. Each chip 502 may have a first side 508a and a second side 508b. The redistribution structure 506 may be formed over the first side 508a of the one or more chips 502 either before encapsulating the one or more chips 502 or after encapsulating the one or more chips 502. The redistribution structure 506 may be electrically coupled to the one or more chips 502. The method may further include forming (e.g. placing) at least one block external from the chip 502, e.g. before the encapsulation material is formed over the chip so that the chip and the block are encapsulated together. The at least one block may include at least one of a semiconductor structure and an electrically conductive structure 512. The at least one block and hence the at least one of the semiconductor structure and the electrically conductive structure 512, may be electrically coupled to the redistribution layer 506. The method may further include forming the metal layer 510 over the second side 508b of the one or more chips 502. The metal layer 510 may be electrically coupled to the at least one of the semiconductor structure and the electrically conductive structure 512.

If there are more than one chip, the encapsulated chips may be sawn or diced to form individual package arrangements. The metal layer 510 may be formed either before sawing/dicing or after sawing/dicing. Sawing or dicing may be carried out before or after forming the metal structure 410. Sawing or dicing may include sawing or dicing through the at least one block. As shown in FIG. 5B, dicing lines 518 may be along the at least one block.

The redistribution structure 506 or the metallization layers/interconnects 506a of the redistribution structure 506 may cover only partially the entire first side of the package arrangement. The metal structure 510 may cover only partially the entire second side of the package arrangement. The package arrangement may be configured to be diced or sawn along the portions of the package arrangement without metallization layers or interconnects or metal structure. In other words, the redistribution structure 506 may be only over certain portions of the first side of the package arrangement or the distribution structure 506 may be configured such that only the dielectric material 506b is over certain portions of the first side of the package arrangement. The metal structure 510 may be over certain portions of the second side of the package arrangements. The redistribution structure 506 may be discontinuous and may include a plurality of redistribution structure segments. The metal structure 510 may be discontinuous and may include a plurality of metal structure segments. Portions of the package arrangement may be free of redistribution structure segments (or only be covered by dielectric material 506b of the distribution structure 506) or metal structure segments so that lines substantially perpendicular to the plane of the package arrangement may not cut through the redistribution structure segments (metallization layers or interconnects 506a) or the metal structure segments. The lines 518 may also not cut through the chips 502. The lines 518, may however, pass through the at least one block. The lines 518 may be configured to be dicing lines such that when the package arrangement is diced or sawn, the metallization layers or interconnects 506a of the redistribution structure segments or the metal structure segments or the chips 502 may not be diced or sawn.

In various embodiments, a package arrangement is provided. The package arrangement may include at least one chip, at least one bulk semiconductor piece at a package corner; encapsulation material at least partially encapsulating the chip and bulk semiconductor piece; a redistribution structure over a first side of the chip and conduction the bulk semiconductor piece; and a metal structure over a second side of the chip, connected to bulk semiconductor piece, wherein the second side is opposite the first side.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A package arrangement, comprising:
   at least one chip;
   encapsulation material at least partially encapsulating the chip;
   a redistribution structure over a first side of the chip;
   a metal structure over a second side of the chip, wherein the second side is opposite the first side; and
   a semiconductor structure electrically coupled to the redistribution structure and the metal structure;
   wherein semiconductor material of the semiconductor structure forms a current path between the redistribution structure and the metal structure;
   wherein the semiconductor structure comprises at least one block external from the chip, wherein the at least one block comprises the semiconductor material and wherein the at least one block further comprises electrically conductive plastic material;
   wherein the at least one block is configured to be diced or sawn; and
   wherein the at least one block is arranged at least partially along the perimeter of the package arrangement.

2. The package arrangement of claim 1 wherein the redistribution structure comprises a multi-layer structure.

3. The package arrangement of claim 2, wherein the multi-layer structure comprises a laminate.

4. The package arrangement of claim 3, wherein the multi-layer structure comprises a thin-film multi-layer structure.

5. The package arrangement of claim 1, wherein the redistribution structure is coupled to a reference potential.

6. The package arrangement of claim 1, wherein the metal structure is configured as a radio frequency shielding structure.

7. The package arrangement of claim 1, wherein the metal structure covers the entire second side of the package arrangement.

8. The package arrangement of claim 1, wherein the semiconductor structure is solar grade silicon.

9. The package arrangement of claim 1, wherein the semiconductor structure is a polycrystalline silicon.

10. The package arrangement of claim 1, wherein the semiconductor structure is formed by bulk semiconductor material.

11. The package arrangement of claim 1, wherein semiconductor structure is in physical contact with at least one of the redistribution structure and the metal structure.

12. The package arrangement of claim 1, wherein the at least one block provides an electrically conductive connection to the metal structure and a reference potential.

13. The package arrangement of claim 1, wherein the at least one block is arranged next to the chip.

14. The package arrangement of claim 1, wherein the at least one block is at least partially arranged in an edge region of the package arrangement.

15. The package arrangement of claim 14, wherein the at least one block is at least partially arranged in a corner region of the package arrangement.

16. The package arrangement of claim 1, wherein the at least one block comprises a plurality of blocks.

17. The package arrangement of claim 16, wherein the blocks of the plurality of blocks are arranged in respective corner regions of the package arrangement.

18. The package arrangement of claim 1, wherein the semiconductor structure comprises silicon.

19. The package arrangement of claim 18, wherein the silicon comprises silicon selected from a group consisting of:
    monocrystalline silicon;
    polycrystalline silicon; and
    amorphous silicon.

20. The package arrangement of claim 1, wherein the at least one chip comprises a plurality of chips;
    wherein the encapsulation material at least partially encapsulates the plurality of chips; and
    wherein the block is shared by the plurality of chips to form a plurality of current path for a respective chip.

21. A package arrangement, comprising:
    at least one chip, at least one bulk semiconductor piece at a package corner at least partially along the perimeter of the package arrangement, wherein the at least one bulk semiconductor piece further comprises electrically conductive plastic material;
    encapsulation material at least partially encapsulating the chip and bulk semiconductor piece;
    a redistribution structure over a first side of the chip and connected to the bulk semiconductor piece; and
    a metal structure over a second side of the chip, connected to the bulk semiconductor piece,
    wherein the second side is opposite the first side.

22. The package arrangement of claim 1, wherein the chip at least partially extends throughout an entire thickness of the package arrangement.

23. A package arrangement, comprising:
- at least one chip;
- encapsulation material at least partially encapsulating the chip;
- a redistribution structure over a first side of the chip;
- a metal structure over a second side of the chip, wherein the second side is opposite the first side; and
- an electrically conductive plastic material structure electrically coupled to the redistribution structure and the metal structure;
- wherein electrically conductive plastic material of the electrically conductive plastic material structure forms a current path between the redistribution structure and the metal structure;
- wherein the electrically conductive plastic material structure comprises at least one block external from the chip, wherein the at least one block comprises the electrically conductive plastic material;
- wherein the at least one block is configured to be diced or sawn; and
- wherein the at least one block is arranged at least partially along the perimeter of the package arrangement.

24. The package arrangement of claim 23, wherein the electrically conductive plastic material comprises a structure selected from the group consisting of:
- a polyalkene,
- a polyaromatic compound comprising a double bond,
- and combinations thereof.

25. The package arrangement of claim 23, wherein the electrically conductive plastic material further comprises:
- carbon black.

* * * * *